United States Patent [19]

Bielat

[11] 4,399,434
[45] Aug. 16, 1983

[54] LINE INDICATING APPARATUS

[76] Inventor: Norbert J. Bielat, 720 South Bristol, Arlington Heights, Ill. 60005

[21] Appl. No.: 271,412

[22] Filed: Jun. 8, 1981

[51] Int. Cl.³ .............................................. G09G 3/00
[52] U.S. Cl. .................................... 340/701; 340/754; 340/815.01; 340/815.1; 340/691
[58] Field of Search ............... 340/701, 753, 754, 756, 340/700, 715, 722, 691, 815.01, 815.02

[56] References Cited

U.S. PATENT DOCUMENTS

| | | | |
|---|---|---|---|
| 2,484,058 | 10/1949 | Steinberger | 340/754 X |
| 3,419,857 | 12/1968 | Martin | 340/701 X |
| 3,469,252 | 9/1969 | Bet | 340/722 X |
| 3,474,438 | 10/1969 | Lauher | 340/722 X |
| 4,200,896 | 4/1980 | Baumann | 340/756 X |

*Primary Examiner*—David L. Trafton
*Attorney, Agent, or Firm*—Myers & Dvorak

[57] ABSTRACT

A line indicating apparatus for visually monitoring changes of physical constants or functions occurring in a dynamic process. The apparatus has a plurality of units or modules which are associated with the monitoring of a corresponding plurality of variables. Each module has at least two indicating sections, each of which is provided with at least two indicating members. An electric circuit is provided for sensing the condition and changes in each monitored variable and providing various outputs to energize one or more indicating members to give a visual indication of the condition of the monitored variable. The modules are aligned with each other in a straight line so that during normal or mode "A" operation of all the variables, particular indicating sections in all of the modules will present a highly visible indicating line or band. In case of a minor deviation occurring in a particular monitored variable, the indicating section associated with the normal operation will go out and an adjacent indicating section in the module will go on to indicate a caution or mode "B" operation. Should a substantial deviation occur in one of the variables or the variable should become non-existent, all indicating sections go on to indicate a danger or mode "C" operation. One of the components forming the line indicating apparatus is a line indicating device in the form of a display panel having a plurality of indicating segments, each having two or more indicating sections which are adapted to be chromatically stressed by any well-known forms, such as colored tabs which are mechanically or manually affixable to respective indicating sections.

16 Claims, 14 Drawing Figures

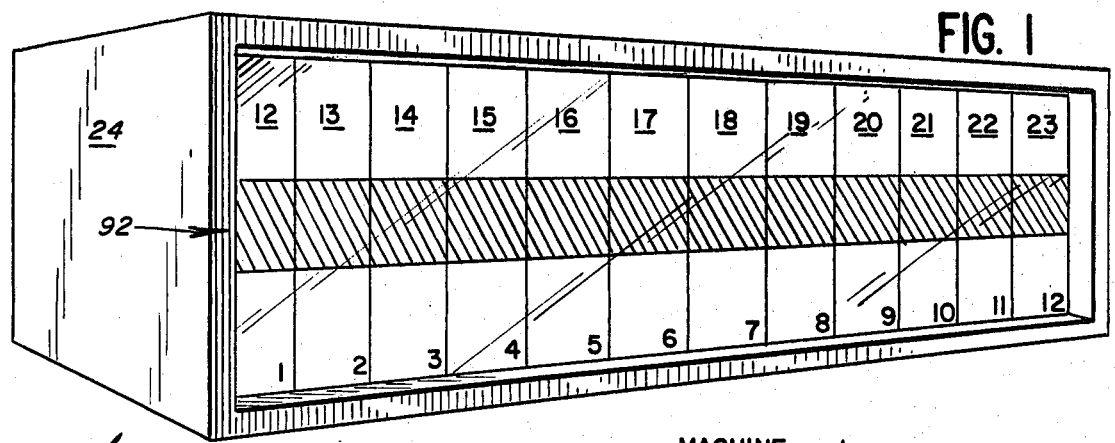
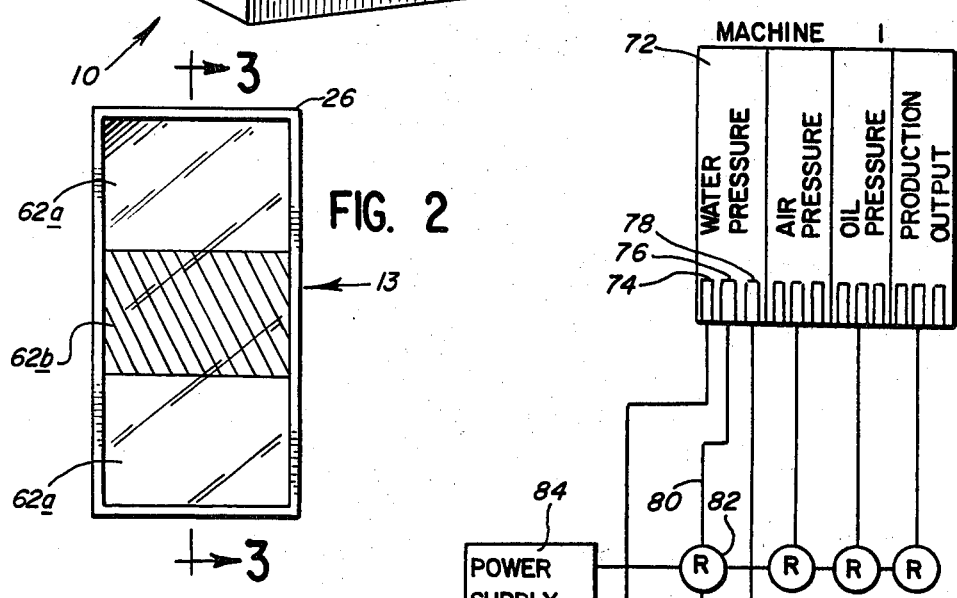
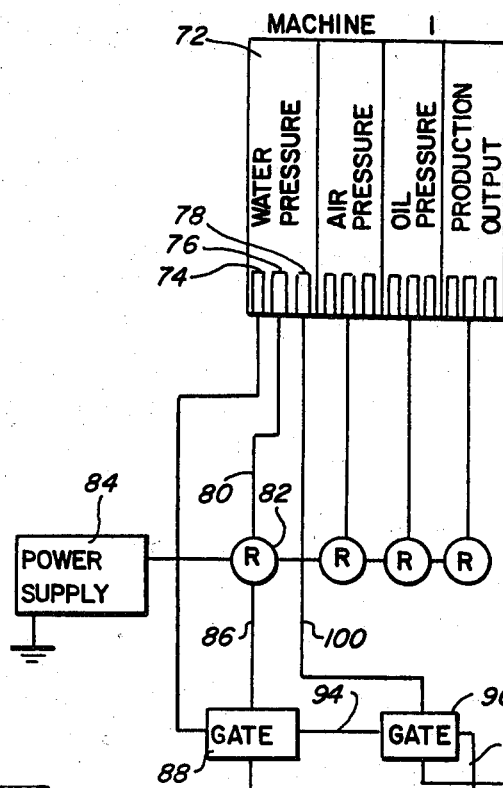
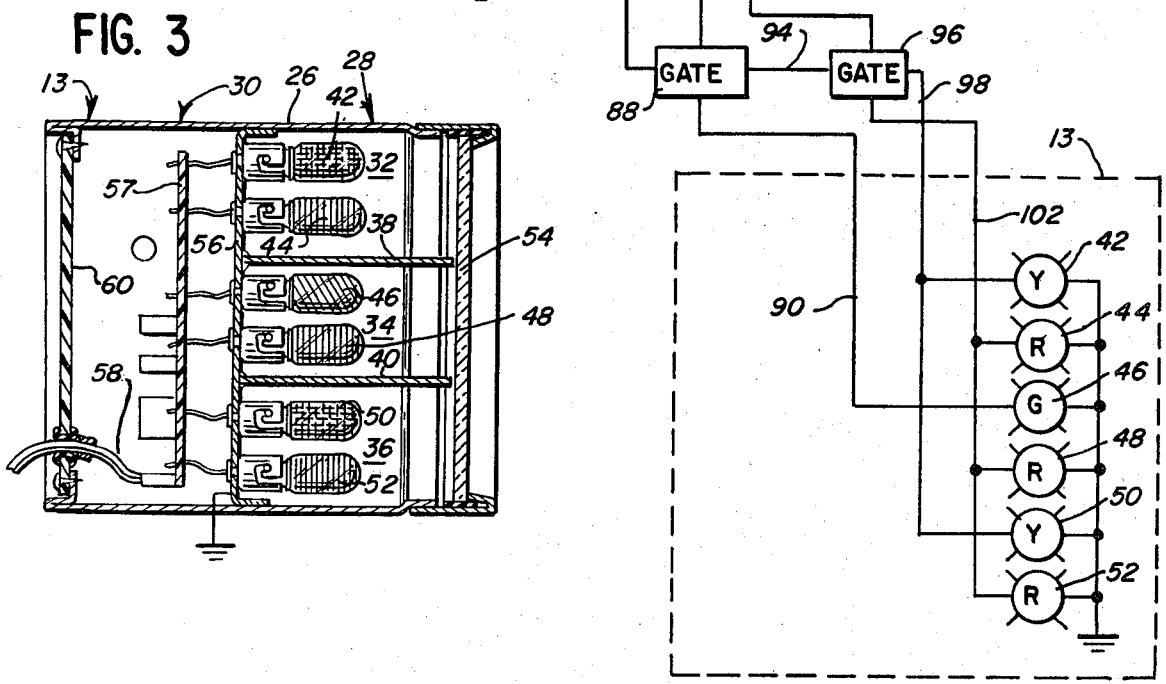

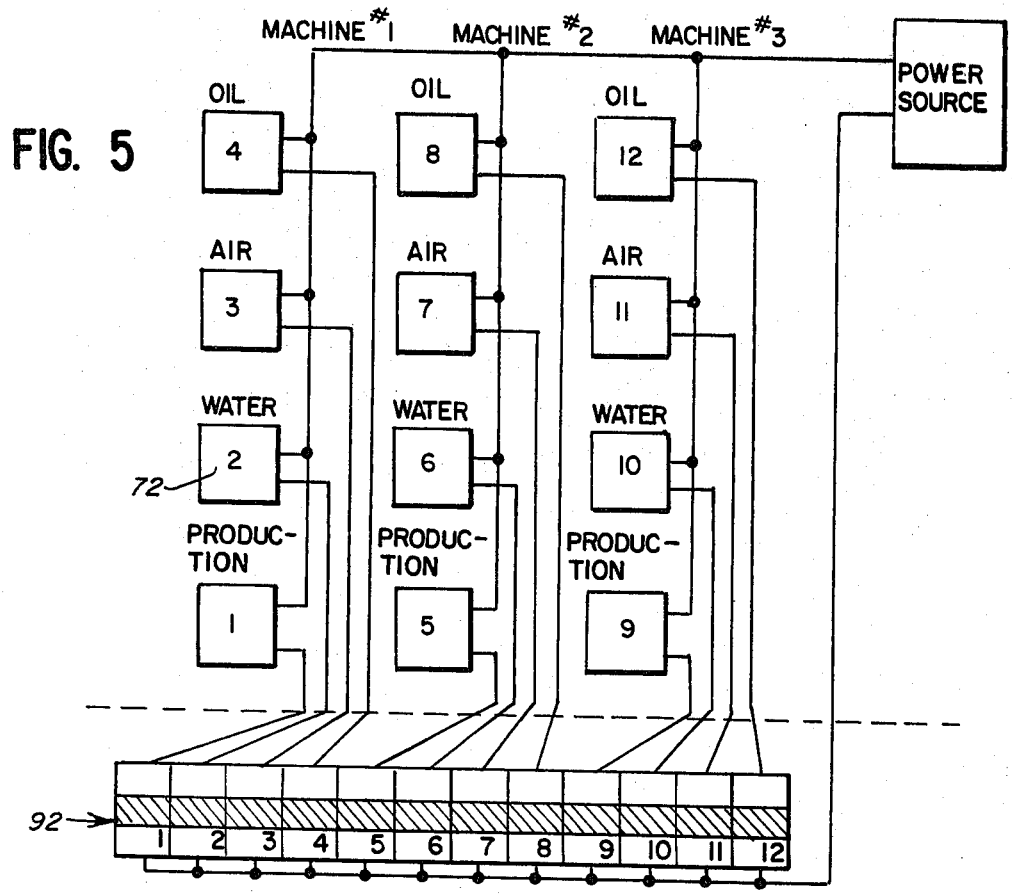
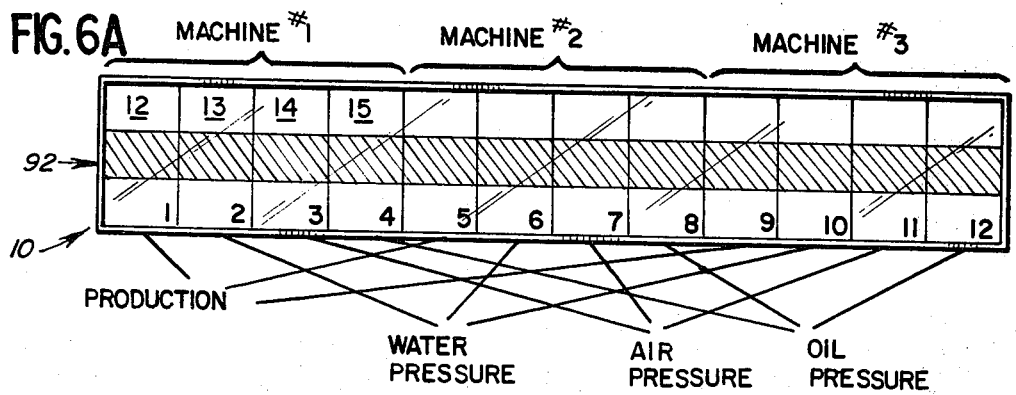
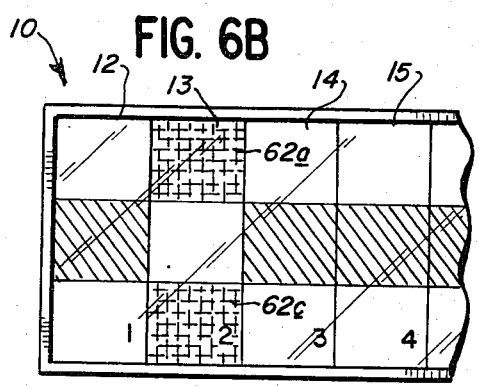
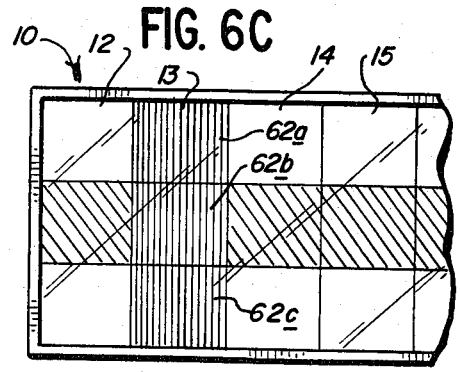

LINE INDICATING APPARATUS

BACKGROUND OF THE INVENTION

1. FIELD OF THE INVENTION

This invention relates generally to indicating systems, and more particularly to a visual monitoring system which is used to assess the changes in physical constants and functions occurring in any dynamic process.

2. DESCRIPTION OF THE PRIOR ART

U.S. Pat. No. 3,251,049 describes a master warning indicator system. A source indicator comprising a plurality of colored lights is used to monitor the condition of a variable. This known system, although satisfactory, is complex in view of the fact that a solenoid is employed with each source indicator to activate one or more of the lights. Maintenance problems associated with solenoid devices are well known.

U.S. Pat. No. 2,084,169 describes an indicating system which uses a plurality of circuits in combination with vibrating reeds to indicate whether related circuits are alive. Aside from the complexity of using vibrating reeds and their attendant maintenance problems, lights are not employed to indicate the degree of deviation from a normal condition of the operating function. Also, the known system is dependent on exterior illumination in the room so that visual observation can take place.

SUMMARY OF THE INVENTION

This invention relates to visual monitoring of different variables or conditions, such as mechanical or electrical processes encountered during manufacturing operations. The primary purpose of this invention is to simplify the work of observation of personnel who monitor a large number of conditions. For monitoring a plurality of variables or conditions, a corresponding plurality of monitor units or modules is assembled together to form a line indicating apparatus which defines a pre-planned line which indicates the normal operation of the plurality of variables. Disposed on both sides of the pre-planned line are subsidiary lines which are adapted to indicate caution caused by deterioration in the magnitude or condition of the variable, or to give a warning of a serious change or absence or failure of the variable. Thus, the line indicating apparatus is capable of operating in three modes, mode "A" indicating normal operation, mode "B" indicating caution, and mode "C" indicating danger.

Essentially, each variable is monitored by a monitor unit having two or more indicating members such as colored lights. The monitor units are assembled side by side horizontally so that under normal operation, all of the units will define a highly visible continuous line indication which, in the case of using colored lights, will be a single illuminated line or a band. The monitor unit has at least two sections which are vertically disposed with respect to each other. In the preferred embodiment of the invention, the monitor unit has three sections, each section having two or more colored lights. The middle section of each monitor unit, when aligned with the middle sections of other similar monitor units, will define a horizontal line possessing a particular color representation, such as green, which denotes a normal operating condition for all of the monitored variables. Thus, a continuous green line or band is highly visible and can be observed without any effort on the part of the operating personnel. In the event that a minor deviation occurs in one of the monitored variables, the colored lights, such as yellow, in the other two sections, will go on and the associated green light will go out. This caution condition is readily observable by the operating personnel, which will then be in position to look into the matter and to rectify the condition and bring the operation back to normal. In the event that the variable which is being monitored is no longer present, or the operating range limits of the monitored variable are such that a breakdown or a shutdown will occur, the middle section having the green light will go out and all three sections of the respective monitor unit will show or give a warning, wherein all three sections glow in a single color such as red.

As described herein, the line monitoring apparatus operates in three modes, mode "A" indicating a normal operation, mode "B" indicating caution as a result of minor deterioration in the monitored variable, and mode "C" indicating a warning of impending or actual breakdown or shutdown.

To effect a display of a proper indication, such as by the selective energization of different colored lights for the different modes of operation, an electrical circuit using solid state elements is disclosed. The use of solid state circuitry for controlling the operation of the different indicating members avoids the problems of maintenace which are associated with mechanical and electro-mechanical control devices.

An object of the invention is a line indicating apparatus which makes a visual presentation of monitored variables or conditions associated with a particular operation.

It is a further object of the invention to provide a line indicating apparatus which shows a normal operation of a plurality of monitored variables by a single line or band.

It is also the object of the invention to provide a line indicating apparatus which shows a normal operation of a plurality of monitored variables by a single line or band and a deviating operation in any one of the variables by a visual disturbance in the area on the band allocated to such variable.

It is still a further object of the invention to provide a line indicating apparatus which visibly presents measured ranges of monitored variables by one or more lines or bands which are highly discernable to monitoring personnel.

A further object of the invention is a line indicating apparatus which provides a visible read-out for monitored variables reflecting normal operation, caution operation and danger operation.

Another object of the invention is an apparatus for monitoring a plurality of varaibles or conditions and visually presenting the results of such monitoring in the form of one or more highly visible lines or bands.

A further object of the invention is a line indicating apparatus having a plurality of monitor modules, each associated with a monitored variable, the modules being aligned to present a single line or band which, when actuated, will present a highly visible indication of the state of the monitored variables.

A still further object of the invention is a line indicating device in the form of an elongated display panel for chromatically presenting data.

BRIEF DESCRIPTION OF THE DRAWINGS

FIG. 1 is an isometric view of a line indicating apparatus having a plurality of monitor modules for monitoring twelve variables or conditions;

FIG. 2 is a front view of a monitor module;

FIG. 3 is a sectional view taken along the line 3—3 of the module shown in FIG. 2;

FIG. 4 is a schematic diagram of a single monitor module adapted to indicate the condition of a single variable, such as water pressure;

FIG. 5 is a schematic diagram of the line indicating apparatus adapted to monitor twelve variables associated with the operation of three machines;

FIG. 6A outlines the monitoring relationship of the line indicating apparatus connected to the three machines shown in FIG. 5, which machines are operating normally under a condition defined as a normal operating mode, as indicated by a continuous indicator line;

FIG. 6B is a partial view of the line indicating apparatus in which a second monitor module is giving an indication that one of the variables in one of the machines has a minor deviation and is giving an indication of an operation in a cautionary mode;

FIG. 6C is a partial view of the line indicating apparatus in which the second monitor module is giving an indication that one of the variables in one of the machines has a substantial deviation from normal or is entirely absent and gives an indication of an operation in a danger mode;

DESCRIPTION OF THE PREFERRED EMBODIMENT

Figure 7A:
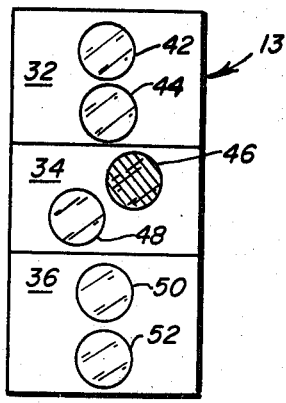
FIGS. 7A and 7B illustrate the monitoring of a single variable in its normal range and indicating a normal operating "A" mode.

The preferred embodiment of the invention will now be described in reference to FIGS. 1-9, wherein FIGS. 1-3 provide the structural details of a line indicating apparatus. As shown particularly in FIG. 1, a line indicating apparatus 10 has monitor modules 12-23 which are horizontally aligned with each other by means such as a housing 24. The details of construction of each monitor module, such as module 13, is shown in FIGS. 2 and 3. The monitor module 13 comprises a rectangular container 26 having a forward section 28 and a rear section 30, the forward section having upper, middle, and lower indicating sections or chambers 32, 34, and 36, respectively. The middle chamber 34 is isolated from the upper and lower chambers 32 and 36, respectively, by a pair of walls 38 and 40. The upper chamber 32 houses exciting means such as a yellow lightbulb 42 and a red light bulb 44; the middle chamber 34 houses exciting means such as a green light bulb 46 and a red light bulb 48; and the lower chamber 36 houses exciting means such as a yellow light bulb 50 and a red light bulb 52. Openings of the upper, middle, and lower chambers 32, 34, 36 are closed by a frosted illuminating panel 54. All of the light bulbs which function as indicating members are supported on a wall member 56, which separates the forward section 28 from the rear section 30. All of the light bulbs are connected to a circuit board 57 which is wired to a power cord 58 passing through a rear wall 60 which encloses the rear section 30.

In view of the walls 38 and 40 separating the monitor module 13 into three chmbers, the frosted illuminating panel 54 can be illuminated to provide three indicating sections or light areas 62a, 62b, and 62c, associated with the upper, middle, and lower chambers 32, 34, and 36, respectively.

It should be pointed out that the construction of the monitor module 13 is exemplary only. For example, it would not be necessary to mount each monitor module in a rectangular container, such as 26. All of the light bulbs in all of the monitor modules could be commonly supported by the support wall 56 extending through the entire housing 24. Of course, intervening walls, such as walls 38, 40, would have to be supported by the support wall 56 to define the individual upper, middle, and lower chambers.

The line indicating apparatus 10 shown in FIG. 1 can be used for many purposes, for example, as for the monitoring of twelve different variables associated with the operation of three machines #1, #2 and #3 shown in FIG. 5. Each machine may be of the type which receives a wire stock which is subsequently milled to a proper size, cut and threaded to produce, for example, screws. In view of the mult-operations performed by each machine, these operations are dependent upon proper oil, air and water pressures supplied to each machine. Therefore, it is important that the pressures of the supply sources providing the oil, air and water pressures be monitored so that efficient production can be obtained.

Referring particularly to FIG. 5, it is noted that machine #1 is dependent for proper operation of oil, air, and water pressures to provide a proper production output. Each of the foregoing pressures is monitored by an individual monitor module. For example, monitor module 12 monitors the production output, monitor module 13 monitors water pressure, monitor module 14 monitors the air pressure, and monitor module 15 monitors the oil pressure.

Figure 7B:
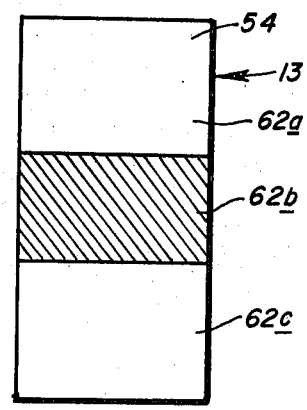

In order to describe the operation of monitoring a particular variable, a water pressure of machine #1 shown in FIG. 5 can be identified by a block 72. This block 72 is also shown in FIG. 4 and is provided with a circuit means which includes three sensors 74, 76, and 78. Machine #1 will operate normally when the water pressure is 90 psi±5 psi. During normal operation, identified as mode "A", sensor 76 will transmit a signal over a line 80 to a relay 82 which, upon energization, will apply a voltage from power supply 84 to a line 86, through a gate 88, and then over a line 90 to energize the green light bulb 46 which illuminates the light area 62b shown by the hatched area in FIGS. 1 and 2. Assuming that all variables associated with all three machines are in the range of normal band operation, there will be a highly visible illuminated green line or band 92, as shown in FIGS. 1, 5, and 6A. The normal operation of the monitor module 13 is also shown in FIGS. 7A and 7B. In FIG. 7A, the interiors of the chambers 32, 34, and 36 are shown exposed, the illumination panel having been removed to reveal the presence of the light bulbs 42, 44, 46, 48, 50, and 52. The green light bulb 46, as shown by the hatching, is energized and illuminates the light area 62b as shown in FIG. 7B.

Figure 8A:
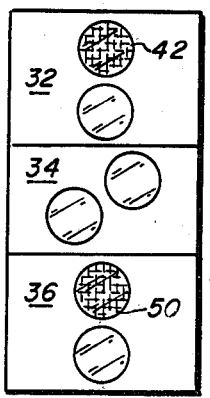
FIGS. 8A and 8B illustrate the monitoring of a single variable which is deviating from the normal operating condition and indicating a cautionary operationg "B" mode.
Figure 8B:
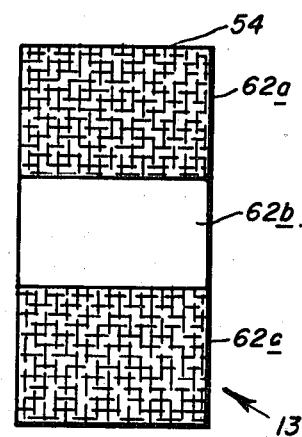

Assuming now that the water pressure in the block 72 deviates within ±10 psi, the sensor 74 will send a signal to the gate 88, which will disconnect the application of the voltage to the line 90 and, at the same time, will apply the voltage to a line 94 and a gate 96, which applies the voltage over line 98 to energize the yellow light bulbs 42 and 50. Since there is no more voltage on line 90, the green light bulb 46 is extinguished. The absence of the green illumination and the illumination created by the two yellow light bulbs 42 and 50 presents a highly visible indication, as shown in FIG. 6B, this indication alerting the operating personnel that the machine #1 is operating in a caution status or mode "B". As a result, a break in the green line 92 is instantly noticeable with the adjacently illuminated yellow light areas 62a and 62c. In this respect, reference should also be made to FIGS. 8A and 8B wherein the illumination of the yellow light bulbs 42 and 50 is shown by hatching. The yellow light bulbs 42 and 50 illuminate the light areas 62l and 62c as shown in FIG. 8B.

In the event that something serious happens to the water pressure in block 72, for example, the pressure goes above 150 psi or below 85 psi, the sensor 78 will transmit a signal over line 100 to the gate 86, which responds to remove the voltage from the line 98, thereby extinguishing the yellow light bulbs 42 and 50, and to apply a voltage over line 102 to energize red light bulbs 44, 48, and 52, to indicate mode "C", or a dangerous operation. The mode "C" is highly visible, as can be observed from FIG. 6C, wherein the light area 62a, 62b, and 62c are brightly illuminated as shown by hatching.

The gates 88 and 96 and the relay 82 define a selective circuit means which is responsible for selectively energizing different light bulbs to indicate different modes of operation.

Figure 9A:
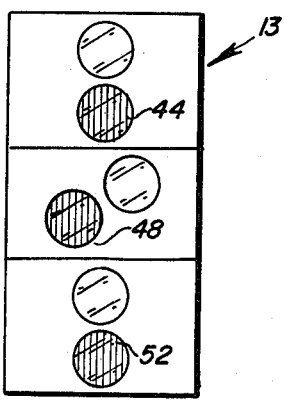
FIGS. 9A and 9B illustrate the monitoring of a single variable having a substantial deviation in the value of the monitored variable or the absence of the variable to indicate that a danger "C" mode has occurred.
Figure 9B:
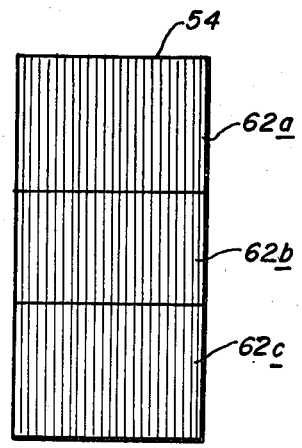

Referring to FIGS. 9A and 9B, the monitor module 13 has all of its three red light bulbs 44, 48, and 52 illuminated, as shown by hatching. The energization of the three red light bulbs illuminates all of the light areas 62a, 62b, and 62c shown in FIG. 9B. The presence of such vertically illuminated red line or band intersecting the green line or band 92 is highly noticeable.

In the preferred embodiment as described herein above, electric colored lights associated with each indicating section are selectively energized by respective circuits to present a highly visible line or band when all indicating sections are indicating normal operation. In the alternative, a line indicating device in the form of an elongated display panel, using other means for presenting visual information or data, for example, the indicating sections, instead of using colored light, can utilize colored tabs which are affixable, positionable or attachable to each indicating section by mechanical means or manually so as to present a single chromatic line indicating normal operation data.

As has been shown and particularly described, a certain embodiment of the invention has been presented together with a particular operation thereof. However, it is obvious to those skilled in the art that many modifications and variations are possible and, therefor, it is the purpose to cover all such modifications and variations as fall within the scope of the invention which is defined in the appended claims.

What is claimed is:

1. In a line indicating apparatus for presenting the stages or conditions of a plurality of monitored variables, means for sensing the states or conditions of said variables and providing outputs, visual means responding to said outputs for visually presenting said outputs, and means for aligning said visual means in a straight line, the improvement wherein each of said visual means comprises two or more indicating sections, and means for exciting at least each section to represent a normal operating range of the respective variable, whereby, when all of said variables are in their normal operating ranges, each section associated with normal operating range in each visual means will be excited and all of said excited sections will present a single highly visible normal operating line or band.

2. A line indicating apparatus according to claim 1, wherein each of said visual means comprises a monitor module, each module being provided with two or more chambers, and said exciting means including two or more colored light bulbs disposed in each of said chambers, said chambers being enclosed by said sections.

3. A line indicating apparatus according to claim 1, wherein each of said visual means comprises a monitor module provided with three chambers vertically aligned, each chamber being associated with an individual section, said exciting means comprising two or more colored light bulbs disposed in each of said chambers, and an electrical circuit for energizing one or more of said colored light bulbs, whereby said electric circuit is selective to energize one or more of said sections depending on the normal value of said monitored variable or the magnitude of variation of the monitored variable from its normal value.

4. A line indicating apparatus according to claim 1, wherein each of said visual means comprises a monitor module having a housing provided with forward and rear sections defined by an intermediary wall, the forward section of the housing having two or more chambers, said exciting means comprising two or more colored light bulbs disposed in each chamber and supported by said intermediary wall, a circuit panel disposed in the rear section and providing a connection to each of said colored light bulbs, and circuit means connected to said circuit panel for providing an electric current to said colored light bulbs.

5. A line indicating apparatus according to claim 4, including an illuminating panel closing said chambers, said illuminating panel having portions associated with each of said chambers and defining said indicating sections.

6. A line indicating apparatus according to claim 5, including a housing for supporting said plurality of monitor modules in a horizontal alignment.

7. A line indicating apparatus according to claim 1, wherein each of said visual means comprises three sections vertically aligned, said exciting means comprising two or more visual indicating members associated with each section, all of said exciting members being mounted on a common member, and wall members vertically and horizontally isolating each of said two or more of said indicating members, whereby, when the magnitudes of the monitored variables are at a desired level, the visual indicating members associated with the middle section will be excited and give a visual indication in the form of a straight line or band and, whenever a deviation occurs in any one of the variables, the indicating members in the adjoining sections will present a visual indication of such deviation.

8. A line indicating apparatus according to claim 7, said exciting means including a circuit means associated with each of said visual indicating members, said circuit means comprising sensor means for monitoring the magnitude and deviations of the monitored variable, a power supply, and selective circuit means interconnected between the power supply and the sensor means for determining which of the indicating members are to be excited, whereby said selective circuit means is adapted to energize the indicating member in the middle section to indicate a mode "A" or normal operation, to energize one of the indicating members in each of the outer sections to indicate mode "B" or a slight deviation from normal operation, or to excite one of the other indicating members in each of said sections to indicate mode "C" or a substantial deviation from normal operation.

9. A line indicating apparatus according to claim 8, wherein each indicating member is a colored light bulb, the light bulbs associated with the middle section being green and red, and the light bulbs associated with the outer sections being yellow and red, said selective circuit means being effective to energize the green light bulb to indicate normal or mode "A" operation, said selective circuit means being effective to energize the yellow light bulbs in both of the outer sections and the extinguishment of the green light bulb in the middle section to indicate a cautionary or mode "B" operation, and said selective circuit means being effective to energize the red light bulbs in all three sections and extinguishment of the green light bulb to indicate a danger or mode "C" operation.

10. A line indicating device comprising an elongated display panel having a plurality of abutting indicating segments, each segment having two or more vertically disposed indicating sections, each segment being associated with a particular variable being monitored, all indicating sections at a single line level being associated with normal operating ranges of a series of said variables, and means responsive to a normal operating range of each variable for chromatically stressing each of said indicating sections in a predetermined manner, whereby, when said indicating segments are used to present conditions of a series of variables, and all variables vary within established normal operating ranges, all of said indicating sections on said single line level will be similarly chromatically identified and present a highly visible chromatic line.

11. A device according to claim 10, said means for chromatically stressing each of said indicating sections includes two or more colored light bulbs associated with each indicating section, and means for selectively energizing said colored light bulbs.

12. A device according to claim 10, said means for chromatically stressing each of said indicating sections is in the form of a tab having a predetermined color and associated with a particular indicating section, and means for visually presenting said tab on said particular indicating section.

13. A device according to claim 12, said means for visually presenting said tab comprises a mechanical arrangement associated with each indicating segment.

14. A device according to claim 10, said means for chromatically stressing each of said indicating sections comprises a tab having a predetermined color, including means for manually affixing said tab to said indicating section.

15. In a line indicating apparatus for presenting the stages or conditions of a plurality of monitored variables, means for sensing the states or conditions of said variables and providing outputs, visual means responding to said outputs for visually presenting said outputs, and means for aligning said visual means in a straight line, the improvement wherein each of said visual means comprises two or more indicating sections, and means for exciting at least each section depending on the magnitude of the respective variable, whereby, when all of said variables possess a desired magnitude, one section in each visual means will be excited and all of said excited sections will present a highly visible line or band, wherein each of said visual means comprises three sections vertically aligned, said exciting means comprising two or more visual indicating members associated with each section, all of said exciting members being mounted on a common member, and wall members vertically and horizontally isolating each of said two or more of said indicating members, whereby, when the magnitudes of the monitored variables are at a desired level the visual indicating members associated with the middle section will be excited and give a visual indication in the form of a straight line or band and, whenever a deviation occurs in any one of the variables, the indicating members in the adjoining sections will present a visual indication of such deviation, said exciting means including a circuit means associated with each of said visual indicating members, said circuit means comprising sensor means for monitoring the magnitude and deviations of the monitored variable, a power supply, and selective circuit means interconnected between the power supply and the sensor means for determining which of the indicating members are to be excited, whereby said selective circuit means is adapted to energize the indicating member in the middle section to indicate a mode "A" or normal operation, to energize one of the indicating members in each of the outer sections to indicate mode "B" or a slight deviation from normal operation, or to excite one of the other indicating members in each of said sections to indicate mode "C" or a substantial deviation from normal operation.

16. A line indicating apparatus according to claim 15, wherein each indicating member is a colored light bulb, the light bulbs associated with the middle section being green and red, and the light bulbs associated with the outer sections being yellow and red, said selective circuit means being effective to energize the green light bulb to indicate a normal or mode "A" operation, said selective circuit means being effective to energize the yellow light bulbs in both of the outer sections and the extinguishment of the green light bulb in the middle section to indicate a cautionary or mode "B" operation, and said selective circuit means being effective to energize the red light bulbs in all three sections and extinguishment of the green light bulb to indicate a danger or mode "C" operation.

* * * * *